(12) United States Patent
Kuroki et al.

(10) Patent No.: US 6,499,007 B1
(45) Date of Patent: Dec. 24, 2002

(54) PARAMETER EDITING METHOD AND SEMICONDUCTOR EXPOSURE SYSTEM

(75) Inventors: Yoichi Kuroki, Utsunomiya (JP); Bunei Hamasaki, Ayase (JP); Hiroki Suzukawa, Utsunomiya (JP); Kenichi Kawai, Utsunomiya (JP); Takahiro Senda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/351,902

(22) Filed: Jul. 14, 1999

(30) Foreign Application Priority Data

Jul. 21, 1998 (JP) .......................................... 10-219905

(51) Int. Cl.⁷ ................................................ G06F 9/45
(52) U.S. Cl. ............................... 703/22; 703/1; 716/19; 700/121
(58) Field of Search .................. 703/1–22; 716/19–21; 700/109–121

(56) References Cited

U.S. PATENT DOCUMENTS

| | | | |
|---|---|---|---|
| 4,918,320 A | | 4/1990 | Hamasaki et al. .......... 250/548 |
| 5,495,417 A | * | 2/1996 | Fuduka et al. .............. 700/121 |
| 5,757,673 A | * | 5/1998 | Osheiski et al. ............ 700/119 |
| 5,914,879 A | * | 6/1999 | Wang et al. ................ 700/111 |
| 5,969,972 A | * | 10/1999 | Kerszykowski et al. .... 700/117 |
| 6,258,169 B1 | * | 7/2001 | Asano ........................ 118/697 |

OTHER PUBLICATIONS

Boning et al, "A General Semiconductor Process Modeling Framework", IEEE Transactions on Semiconductor Manufacturing, vol. 5 No. 4, pp. 266–280 (Nov. 1992).*

Baum et al, "Supporting Semiconductor Manufacturing Simulation Tools Using a Structured Data Model", Proceedings of the 24th Winter Simulation Conference, pp. 879–884 (1992).*

McIlrath et al, "CAFE—The MIT Computer–Aided Fabrication Environment", IEEE Transactions on Components, Hybrids, and Manufacturing Technology, vol. 15 No. 2, pp. 353–360 (May 1992).*

* cited by examiner

*Primary Examiner*—Samuel Broda
(74) *Attorney, Agent, or Firm*—Fitzpatrick, Cella, Harper & Scinto

(57) ABSTRACT

In editing of a job parameter in a semiconductor exposure apparatus controlled by the job parameter, which is a collection of parameters, a first parameter set independent of the model of the semiconductor exposure apparatus and a second parameter set dependent upon the model are edited and saved independently. This makes it possible to improve operability of parameter editing and management in the semiconductor exposure apparatus, ease of maintenance thereof and the ability to use job parameters among various models of apparatus.

20 Claims, 7 Drawing Sheets

FIG. 2
EXPOSURE PARAMETER GROUP 2
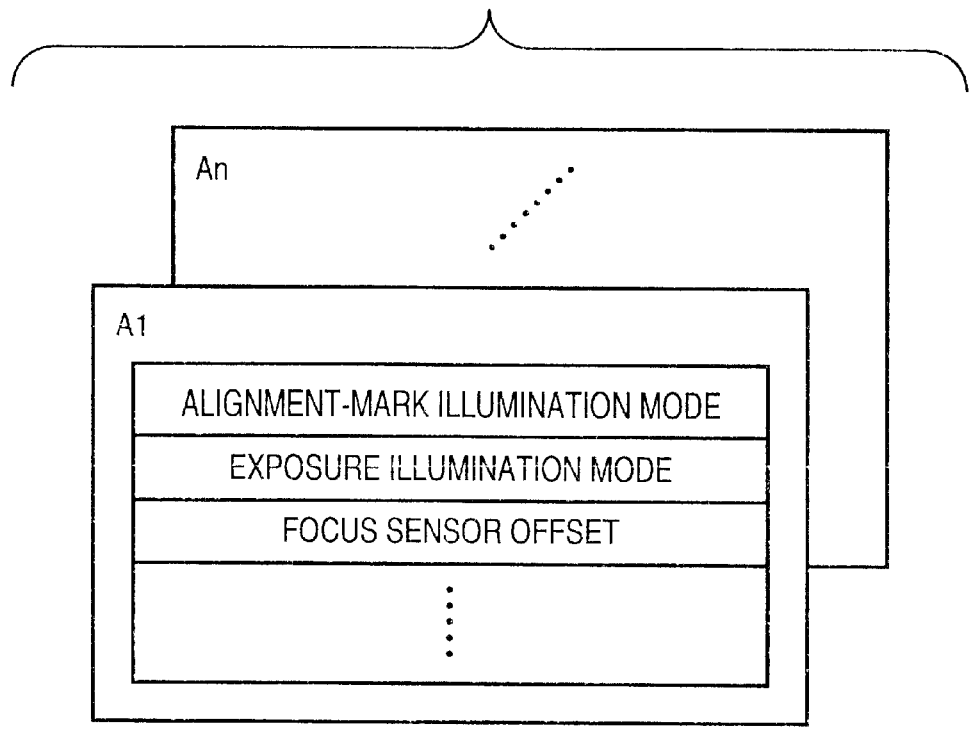
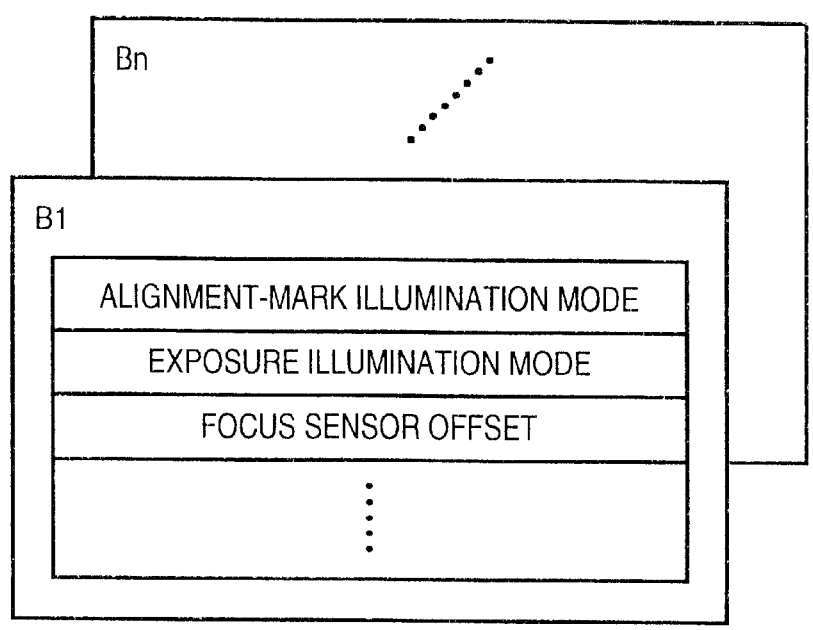

PARAMETER EDITING METHOD AND SEMICONDUCTOR EXPOSURE SYSTEM

BACKGROUND OF THE INVENTION

This invention relates to a parameter editing function for controlling a semiconductor manufacturing apparatus, particularly a semiconductor exposure apparatus that prints circuit patterns on a wafer.

Control parameters in an exposure apparatus used in a semiconductor manufacturing (exposure) process generally are edited using the console (a computer for a man-machine interface) of the apparatus.

In recent years, however, the number of control parameters used has increased sharply as semiconductors become increasingly minute. There has also been an increase in the number of semiconductors and in the number of control parameter sets retained by the apparatus. As a consequence, general-purpose computers other than computers employed in semiconductor manufacture have begun to be used to edit and manage exposure parameters and, when required, to distribute the necessary parameters to the necessary exposure apparatus.

In addition, instead of relying upon human intervention, exposure parameter editing per se has begun to be performed automatically by computer having a data linkage with CAD or the like for reticle creation.

However, the parameters of a semiconductor exposure apparatus include parameters such as focus and alignment parameters that differ depending upon the apparatus model. The reason for this is that the type of resist, the manner in which it is applied and the condition of the wafer underlying the resist differ depending upon the wafer process and the kind of wafer, and the mechanisms for detecting focus values and alignment marks accurately under these multifarious conditions are contrived and modified depending upon the particular model.

Stepper parameters consist of the following types, by way of example:

1. layout data stipulating wafer size, step size and the like;
2. reticle data, namely information on the reticle used; and
3. process data necessary for actual exposure, such as amount of exposure, focus value, positions of alignment marks, detection conditions, etc.

The term "job parameter" or simply "job" is used to refer to a set of these parameters collected together for use in controlling an exposure apparatus.

Since the layout data stipulates wafer size, shot size and number of shots, etc., the data generally differs depending upon the type of semiconductor product, especially in the case of memories, and often the process steps for the same types of semiconductor products are almost the same.

The process data is a parameter that is dependent upon the semiconductor manufacturing process. However, there are also parameters decided not only by the semiconductor manufacturing process but also by the combination of manufacturing process and system configuration of the exposure apparatus. For example, focus detection mode, alignment mode and alignment mark illumination conditions are applicable to such parameters.

Accordingly, many of the parameters required for an apparatus of Model A will not be necessary in a situation where an apparatus of Model B is used.

This means that when editing a job parameter (a job), it is necessary to specify beforehand which parameters are for which model apparatus.

At a semiconductor plant possessing apparatus of a number of models, therefore, the models may differ even though the exposure parameters may resemble one another. If the models differ, all parameters necessary as a job parameter must be edited for the models that differ. The number of times such an editing operation is performed is the same when done manually by a human being and when done automatically by the aforementioned computer.

In parameter management also, it is necessary that all parameters be retained for each model in regard to one job parameter set.

SUMMARY OF THE INVENTION

Accordingly, an object of the present invention is to provide a method of editing parameters of a semiconductor exposure apparatus, as well as a method of manufacturing a device, in which operability of parameter editing and management, ease of maintenance and the ability to use a job parameter among various models of apparatus are improved.

According to the present invention, the foregoing object is attained by providing a method of editing a job parameter in a semiconductor exposure apparatus controlled by a job parameter consisting of a set of parameters, wherein it is possible to independently edit and save a first parameter set that is independent of the model of the semiconductor exposure apparatus, and a second parameter set that is dependent upon the model of the semiconductor exposure apparatus.

Editing of the first parameter is started without designating the model; the model may be designated when editing ends. Editing and saving of parameters may be performed without designating the model, with the model being designated when the saved parameter set is used.

In order to operate the semiconductor exposure apparatus, it is necessary to set each parameter of the second parameter set after the model is designated when editing of the first parameter set ends or when the first parameter set is used. In order to simplify the editing process, preferably the setting operation is such that a setting is made by selecting default values, which are provided beforehand by each manufacturer for every model, or any set from a group of second parameter sets provided beforehand for other jobs.

Accordingly, in an embodiment of the present invention, a plurality of second parameter sets are edited in advance for each model and the edited parameters are managed by being grouped according to model.

Further, in accordance with the present invention, there is provided a device manufacturing method in which the first parameter set and second parameter set edited independently as mentioned above are linked to form a job parameter, and a semiconductor device is manufactured by controlling an exposure apparatus in accordance with this job parameter.

The independently saved first parameter set and second parameter set can also be linked whenever they are used. Adopting such an expedient makes it unnecessary to save the first parameter set redundantly for every exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate the embodiments of the invention and, together with the description, serve to explain the principles of the invention.

FIG. 2 is a diagram illustrating the structure of a parameter set that is dependent upon the model of a semiconductor exposure apparatus according to the embodiment of the present invention;

DESCRIPTION OF THE PREFERRED EMBODIMENTS

Preferred embodiments of the present invention will now be described in detail in accordance with the accompanying drawings.

Figure 1:
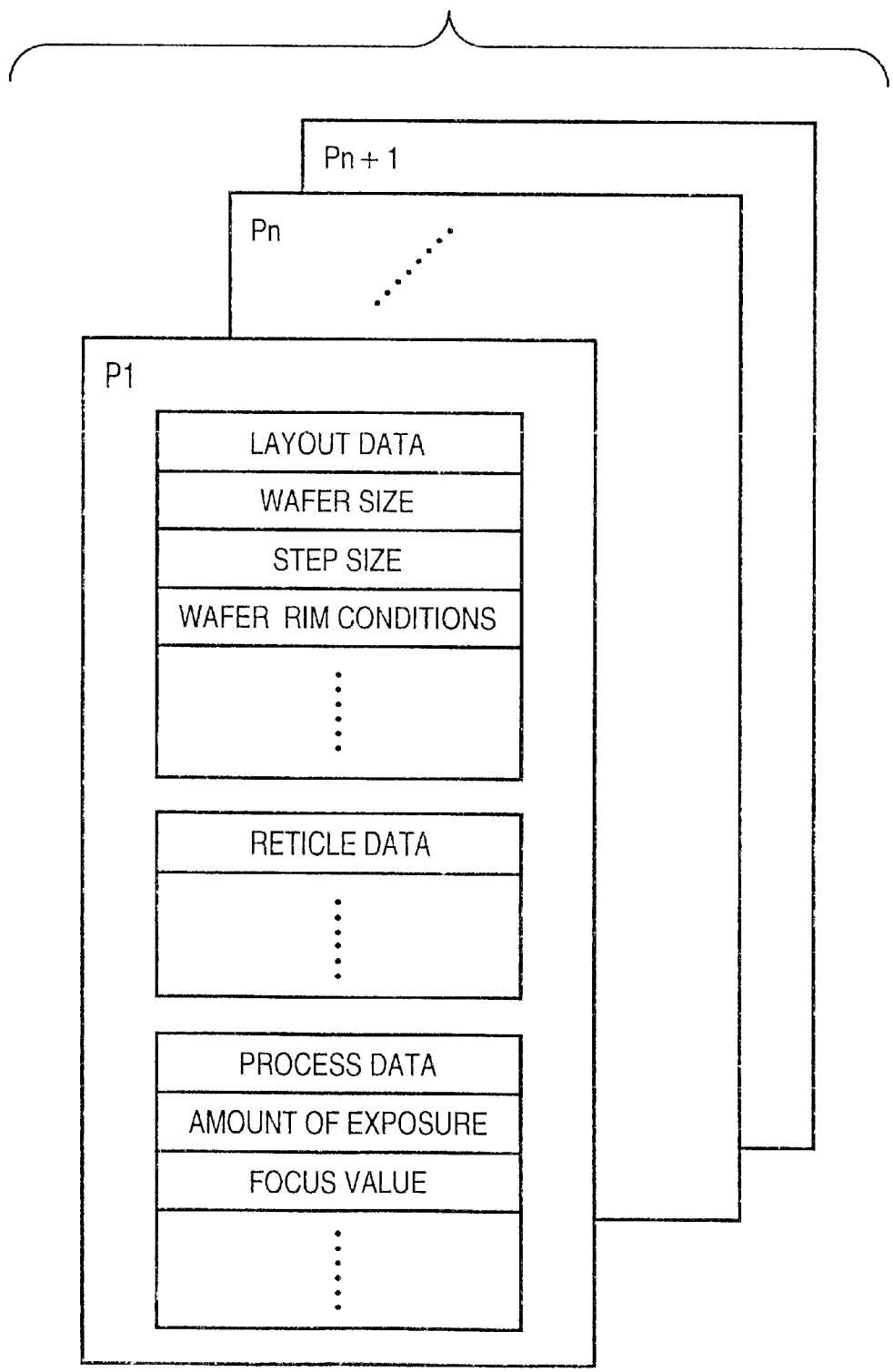
FIG. 1 is a diagram illustrating the structure of a parameter set that is independent of the model of a semiconductor exposure apparatus according to an embodiment of the present invention.

FIGS. 1 and 2 are diagrams showing the structure of parameters of a semiconductor exposure apparatus according to an embodiment of the present invention.

An exposure parameter group 1 in FIG. 1 is a collection of parameters that are not dependent upon the type of exposure apparatus. According to this embodiment, classification is in groups of layout data, reticle data and process data.

In a case where an exposure parameter is created anew to manufacture a semiconductor device of a new type, first the parameter is registered anew in the exposure parameter group 1 shown in FIG. 1.

Registration may be performed by an operation in which an already existing parameter is copied and then modified. For example, this is an example in which Pn in already existing P1 to Pn in the exposure parameter group 1 of FIG. 1 is copied and added on as Pn+1.

In this editing, parameters decided by the model of exposure apparatus and the semiconductor manufacturing process need not be set.

If the editing of a new parameter belonging to the exposure parameter group 1 is finished, only this parameter can be saved under a new name. Of course, use in any semiconductor exposure apparatus is not possible with this parameter alone.

Next, the apparatus used is decided and editing of the parameters that are to belong to an exposure parameter group 2 shown in FIG. 2 is performed.

In FIG. 2, A1 to An represent parameter sets for processes 1 to n in a Model A apparatus, and B1 to Bn represent parameter sets for processes 1 to n in a Model B apparatus. According to this embodiment, models are of only two types, namely A and B, but this number does not represent a limitation and there can be any required number of models.

The editing of the parameter sets belonging to the exposure parameter group 2 can be considered upon division into several cases as follows:

1. a case where the semiconductor exposure apparatus used is already in possession, its use has been mastered and the process employed has been proven by manufacture of other types of semiconductor devices;
2. a case where the semiconductor exposure apparatus used is already in possession and its use has been mastered but the process employed is new and the conditions (the values of the parameters to be set) are unknown;
3. a case where the semiconductor exposure apparatus used is new or already in possession but has not been mastered satisfactorily, though the process employed has been proven by manufacture of other types of semiconductor devices; and
4. a case where the semiconductor exposure apparatus used is new or already in possession but has not been mastered satisfactorily and the process employed is new and the values of the parameters to be set are unknown.

In case 1, it is unnecessary for the parameters belonging to the exposure parameter group 2 to be edited afresh. It will suffice to edit the parameters in the exposure group 1 and then select and link the parameter set for the pertinent model and process from the already existing exposure parameter group 2.

In cases 2 to 4, it is necessary to verify the suitability of the parameters and to adjust the parameters as appropriate. In cases 2 and 3, however, good efficiency is obtained by a method of copying, from the already existing exposure parameter group 2, the parameter set whose conditions are closest and linking this parameter set.

The reason for copying the parameter set is that, in general, the parameters in the already existing exposure parameter group 2 should already be optimized for an existing process on the basis of the combination of apparatus and process, and these parameters cannot be changed.

In case 4, optimization of parameters is carried out anew. In a method that may be used here, the initially set values of job parameters start with default values specified by the manufacturer of the apparatus.

Optimization of parameters is performed by evaluating operations of an exposure apparatus as changing the parameters from the default values. The evaluating items, for example, are as follows:

width and shape of lines formed by an exposure process,
waveform of detection signal for alignment and focusing.

Figure 3:
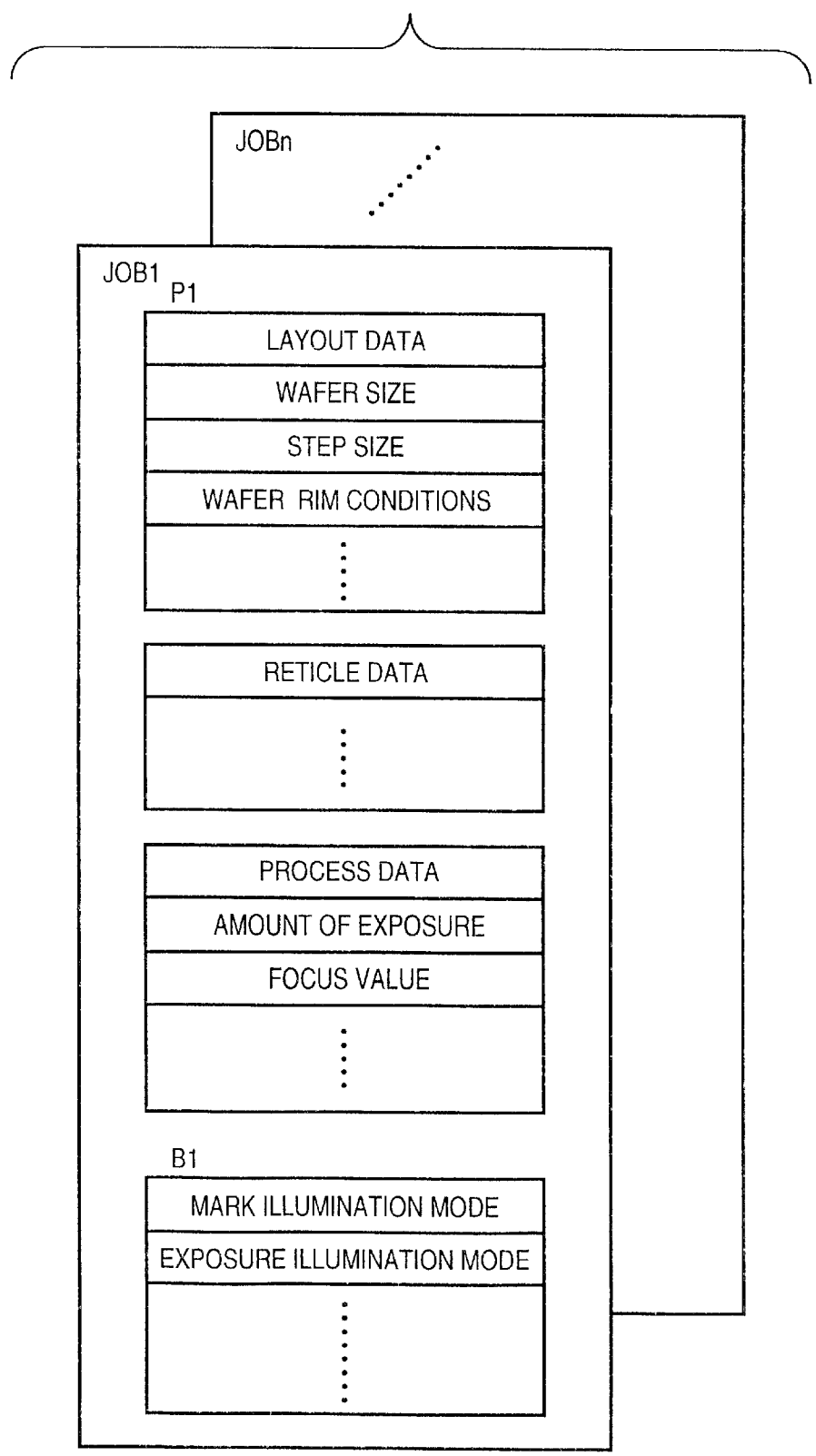
FIG. 3 is a diagram illustrating the structure of a job parameter when a setting according to this embodiment has ended.

In FIG. 3, JOB1 to JOBn indicate an example in which, after the model is designated, all parameters that have been set are saved as a job parameter in a form in which the parameters belonging to the exposure parameter group 1 and the parameters of the exposure parameter group 2 are linked.

The job parameters of FIG. 3 have a structure the same as that of the parameters in the conventional exposure apparatus and can be used immediately in the conventional exposure apparatus.

When parameters are edited, however, it is not always necessary to adopt the parameters having the format shown in FIG. 3.

For example, it is possible to transmit the parameters of the exposure parameter group 1 and the parameters of the exposure parameter group 2 to the exposure apparatus separately and link them on the side of the exposure apparatus. Further, in a case where parameters are transmitted from a job-parameter editing computer to the exposure apparatus via a network or the like, it is possible to transmit the parameters to the exposure apparatus after the above-mentioned linking has been performed in a transmission program.

In this case, the job parameters having the format shown in FIG. 3 no longer need to be saved to a disk or the like. Instead, information for linking the parameters of the exposure parameter group 1 and the parameters of the exposure parameter group 2 is stored.

Figure 4:
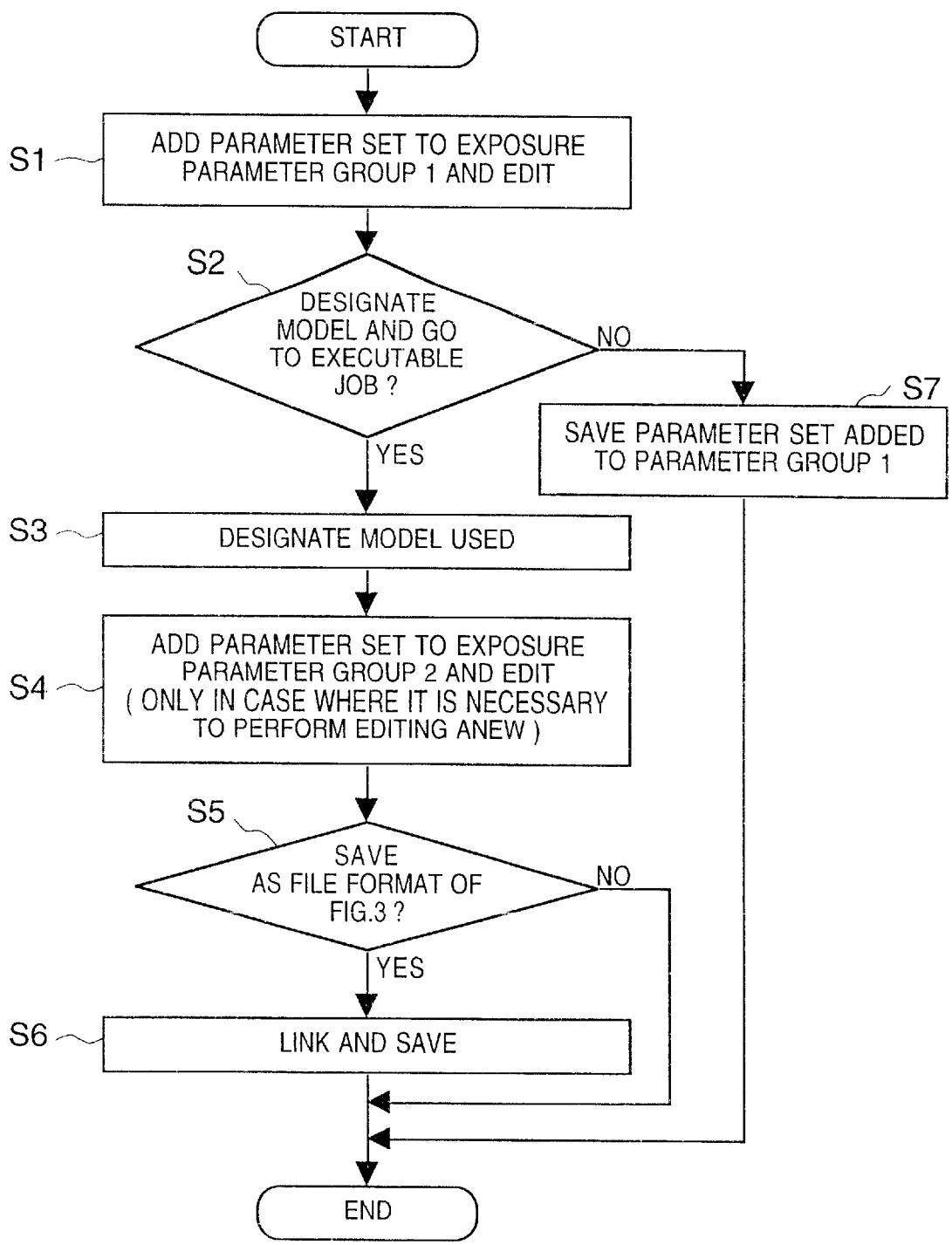
FIG. 4 is a flowchart showing an example of the editing of parameters of a semiconductor exposure apparatus according to the present invention.

FIG. 4 shows an example of a procedure for editing the parameters illustrated in FIGS. 1 to 3.

In a case where an exposure parameter is created anew, first a new parameter set is added to the exposure parameter group 1 and editing is performed (step S1), as shown in FIG. 4. Next, at step S2, it is determined whether to designate a model and go to an executable job. If it is determined at step S2 to go to an executable job in response to a command from the operator, control proceeds to step S3, where the model to be used is designated. This is followed by step S4, at which a parameter set is added to the exposure parameter group 2 and, if necessary, this parameter set is edited. In a case where it is unnecessary to newly edit the parameter set belonging to the exposure parameter group 2 at step S4, an existing parameter set need only be selected from the exposure parameter group 2. When editing of the parameter set of the exposure parameter group 2 is finished, control proceeds to step S5, where it is determined whether to adopt the job file format (the format of FIG. 3). If it is decided at step S5 to adopt the job file format, the added parameter set of the exposure parameter group 1 and the added parameter set of the exposure parameter group 2 are linked and saved (step S6). If it is decided not to adopt the job file format, the parameter sets are saved separately and processing is terminated. If it is determined at step S2 not to designate a model and go to an executable job in response to a command from the operator, then control proceeds to step S7, where only the parameter set that was added to the exposure parameter group 1 is saved, after which processing is terminated.

Note that when job file format data is generated in step S6, a parameter group shown in FIG. 2 remains.

Figure 5:
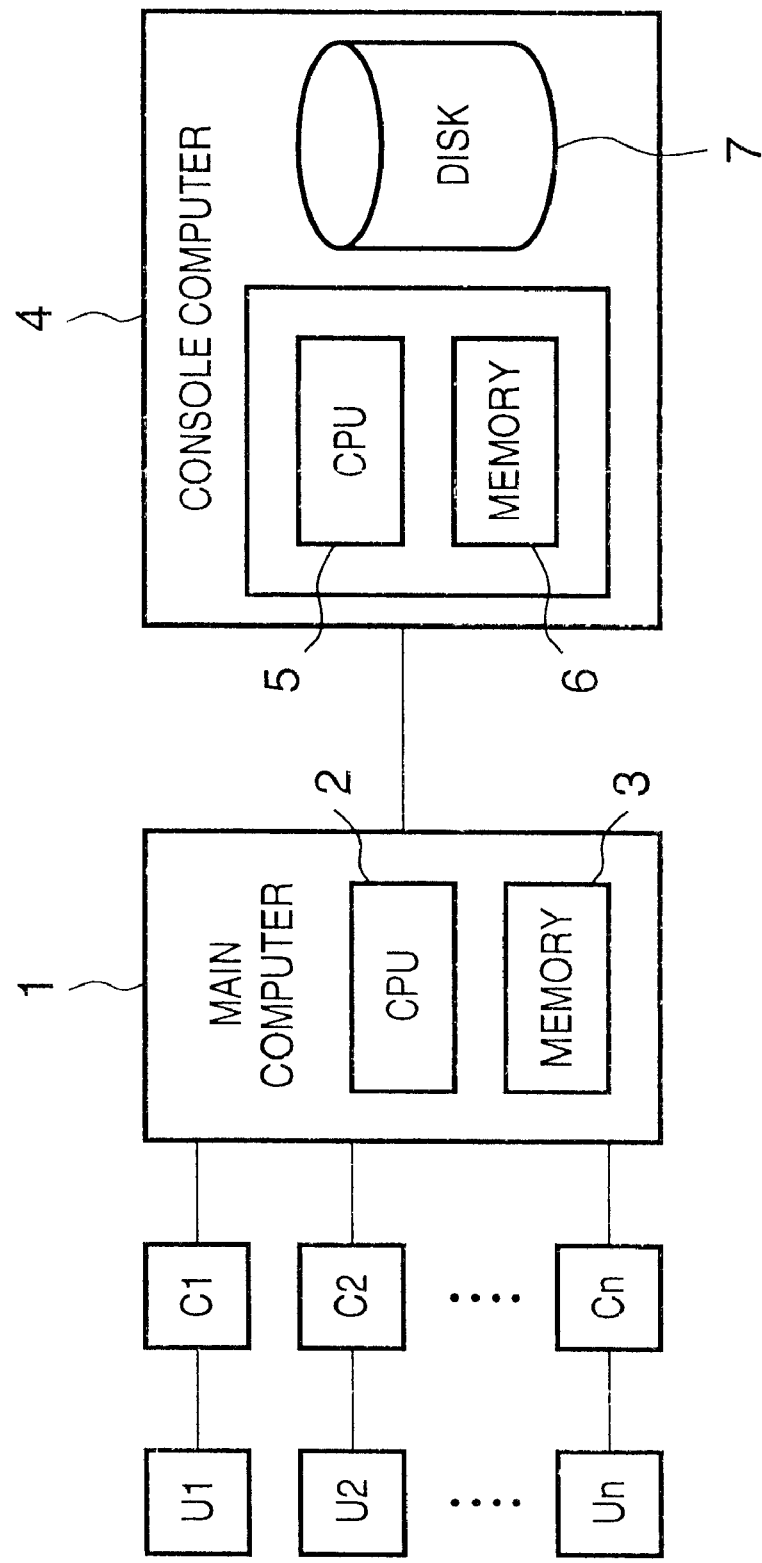
FIG. 5 is a block diagram showing the construction of a control computer of a semiconductor exposure apparatus according to an embodiment of the present invention.

FIG. 5 shows the construction of a control computer for controlling a semiconductor exposure apparatus according to this embodiment.

As shown in FIG. 5, a main computer 1 controls the exposure sequence of a semiconductor exposure apparatus and has a CPU 2 and a memory 3. A console computer 4 is for controlling the semiconductor exposure apparatus and editing the exposure parameters and has a CPU 5, a memory 6 and a disk 7 for storing the control program of the semiconductor exposure apparatus and the exposure parameters.

The console computer 4 and main computer 1 are connected by a communication line (e.g., an Ethernet), and controllers C1 to Cn are connected to the main computer 1. The controllers C1 to Cn control units U1 to Un of the semiconductor exposure apparatus based upon commands from the main computer 1 in the exposure sequence of a semiconductor.

The exposure parameters of the semiconductor exposure apparatus usually are edited in the memory 6 of the console computer 4 and stored in the disk 7 when editing is completed.

In regard to execution of the exposure sequence, the console computer 4 usually reads the set of exposure parameters used out of the disk 7 prior to the start of the exposure sequence and then transmits the parameters to the main computer 1. The latter stores the set of sent exposure parameters in the memory 3 and executes the exposure sequence while referring to the parameters sequentially.

In the case of a stepper which performs exposure by step and repeat, these exposure parameters include the following:

data relating to exposure layout on the wafer, such as number of shots, size of each exposure shot and step pitch;

amount of exposure of each shot and amount of focus offset;

exposure mode of the exposure illumination system at the time of exposure;

type of alignment marks, positions and method of detecting same; and focus detection mode, method and information concerning the sensor used to sense focus/leveling. (In order to sense leveling in a semiconductor exposure apparatus, focus usually is sensed in one shot by a plurality of focus sensors. However, the combination of sensors that can be used differs depending upon the arrangement of the apparatus sensors, the exposure-shot size and position in the wafer, etc.)

Next, an example of a method linking the parameters of the exposure group 1 and the parameters of the exposure group 2 is briefly explained. The console computer 4 receives a parameter set of the exposure parameter group 1 from an external apparatus via a network or the like. The CPU 5 of the console computer 4 reads a parameter set of the exposure parameter group 2 from the disk 7, which corresponds to the received parameter set. Then, CPU 5 appends the parameter set read out of the disk 7 to the end of the received parameter set so as to generate a data file to be used for the exposure process. Then, the console computer 4 transmits the generated data file to the main computer.

In order to line the parameter set of the group 1 with the parameter set of the group 2, the parameter set of the exposure group 1 includes a list as link information. The list contains corresponding parameter sets of group 2 for each exposure apparatus. Therefore, if an exposure apparatus to be used is determined, the console computer 4 is able to choose a parameter set to be used by referring to the list.

Described next will be a process for producing a device by performing editing by the steps explained above and controlling an exposure apparatus by linked job parameters.

Figure 6:
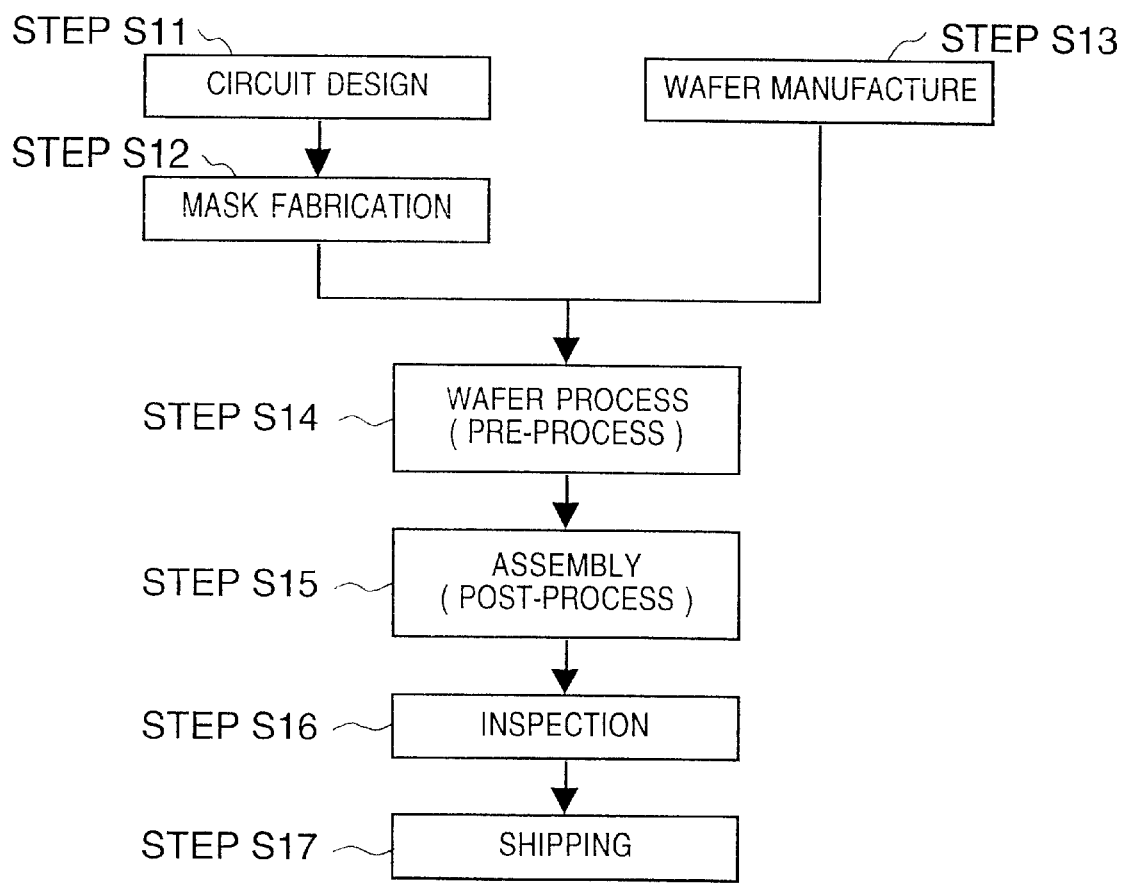
FIG. 6 is a flowchart illustrating the flow of manufacture of a microdevice.

FIG. 6 illustrates the flow of the manufacture of a microdevice (e.g., a semiconductor chip such as an IC or LSI chip, a liquid crystal panel, a CCD, a thin-film magnetic head, a micromachine, etc.). The pattern for the device is designed at step S11 (circuit design). A mask on which the designed circuit pattern has been formed is fabricated at step S12 (mask fabrication). Meanwhile, a wafer is manufactured using a material such as silicon or glass at step S13 (wafer manufacture). The actual circuit is formed on the wafer by lithography, using the mask and the wafer that have been prepared, at step S14 (wafer process), which is also referred to as a "pre-process". A semiconductor chip is obtained, using the wafer fabricated at step S14, at step S15 (assembly), which is also referred to as a "post-process". This step includes steps such as actual assembly (dicing and bonding) and packaging (chip encapsulation). The semiconductor device fabricated at step S15 is subjected to inspections such as an operation verification test and a durability test at step S16 (inspection). The semiconductor device is completed through these steps and then is shipped (step S17).

Figure 7:
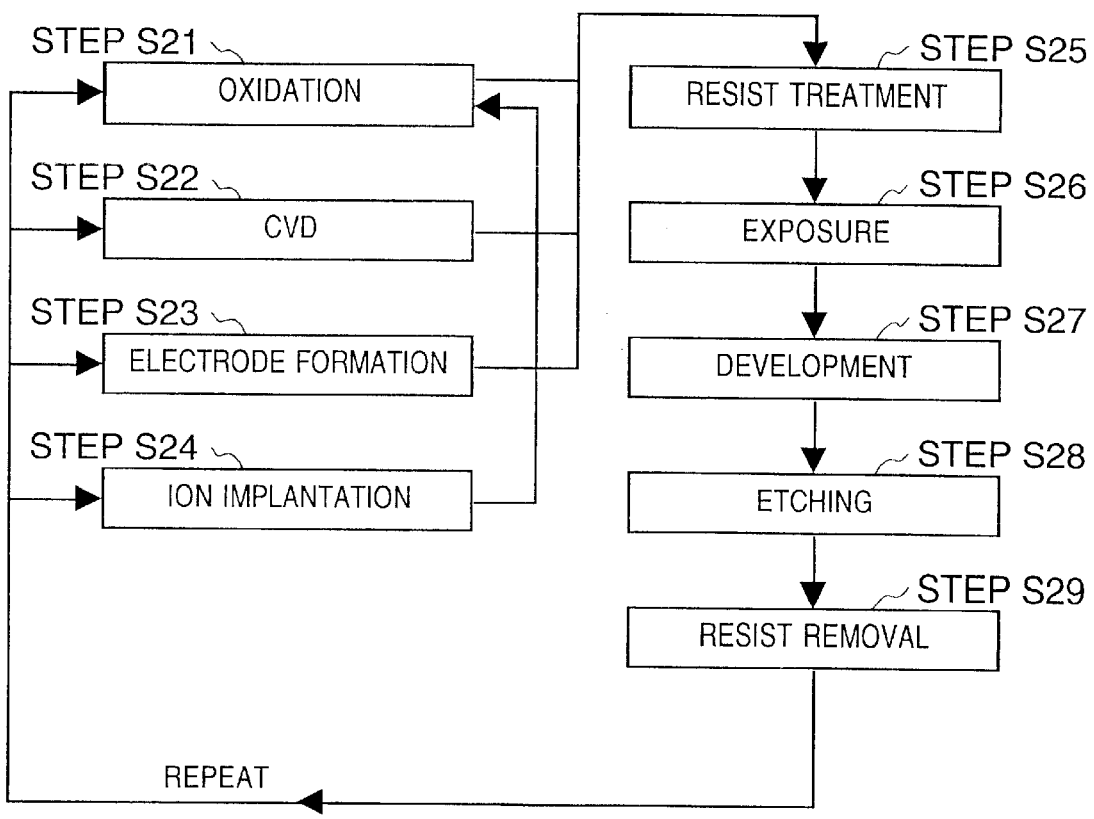
FIG. 7 is a flowchart illustrating the details of the wafer process of FIG. 6.

FIG. 7 is a flowchart illustrating the detailed flow of the wafer process mentioned above. The surface of the wafer is oxidized at step S21 (oxidation). An insulating film is formed on the wafer surface at step S22 (CVD), electrodes are formed on the wafer by vapor deposition at step S23 (electrode formation), and ions are implanted in the wafer at step S24 (ion implantation). The wafer is coated with a photoresist at step S25 (resist treatment), the wafer is exposed to the circuit pattern of the mask to print the pattern onto the wafer by the above-described projection exposure apparatus at step S26 (exposure), and the exposed wafer is developed at step S27 (development). Portions other than the developed photoresist are etched away at step S28 (etching), and unnecessary resist left after etching is performed is removed at step S29 (resist removal). Multiple circuit patterns are formed on the wafer by implementing these steps repeatedly.

According to this embodiment, it is possible to conserve resources needed in editing of job parameters in each process repeated at a device manufacturing plant having a plurality of semiconductor exposure apparatus. In addition, parameter management, ease of maintenance and the ability to use job parameters among various models of apparatus are vastly improved. This makes it possible to manufacture semiconductor devices efficiently.

In accordance with the present invention, as described above, parameter editing is performed without designating a model. The model is designated when parameter editing is finished or when the parameters are used. In regard to parameters that have not been set, suitable parameters from parameter sets provided in advance are linked when a model is designated. This greatly improves operability of the parameter editing and management.

Further, in parameter management, it is no longer necessary to store all parameters in regard to one job parameter for every model, as is required in the prior art. Management of common parameter groups and management of parameter groups decided by a combination of each exposure apparatus and exposure process can be performed independently. This makes it possible to greatly improve management of exposure parameters, ease of maintenance and the ability to use job parameters among various models of apparatus.

As many apparently widely different embodiments of the present invention can be made without departing from the spirit and scope thereof, it is to be understood that the invention is not limited to the specific embodiments thereof except as defined in the appended claims.

What is claimed is:

1. A parameter editing method for editing a job parameter that stipulates operation of a semiconductor exposure apparatus, said method comprising:

a storage step of dividing the job parameter into a first parameter set that is independent of the model of the semiconductor exposure apparatus and a second parameter set that is dependent upon the model of the semiconductor exposure apparatus, and storing the first and second parameter sets independently in a memory in an accessible fashion; and an editing step of editing the first and second parameter sets independently when the job parameter is to be edited, wherein said editing step includes editing the first parameter set without designating the model and editing the second parameter set after the model is designated.

2. The method according to claim 1, wherein said storage step includes storing the edited first and second parameter sets in memory in association with one job parameter.

3. The method according to claim 1, wherein said editing step includes designating a model and editing the second parameter set when editing of the first parameter set ends.

4. The method according to claim 1, wherein said editing step includes designating a model and editing the second parameter set when the first parameter set is used.

5. The method according to claim 1, wherein when the second parameter set is edited in said editing step, a parameter set that has been selected from a group of second parameter sets regarding a designated model and stored in said memory in advance is set.

6. The method according to claim 1, wherein when the second parameter set is edited in said editing step, a parameter set that has been selected from a group of second parameter sets regarding a designated model and stored in said memory in advance is set.

7. The method according to claim 1, wherein said storage step includes grouping and storing in the memory a plurality of the second parameter sets for each of a plurality of models.

8. The method according to claim 1, further comprising a step of generating one set of job parameter sets from the first and second parameter sets edited in said editing step and storing this set in the memory.

9. The method according to claim 1, further comprising a step of generating link information that links the first and second parameter sets edited in said editing step and storing the link information in the memory together with the first and second parameter sets.

10. A semiconductor exposure system comprising:

storage means for dividing a job parameter, which stipulates operation of a semiconductor exposure apparatus, into a first parameter set that is independent of the model of the semiconductor exposure apparatus and a second parameter set that is dependent upon the model of the semiconductor exposure apparatus, and for storing the first and second parameter sets independently in an accessible fashion;

editing means for editing the first and second parameter sets independently when the job parameter is to be edited, wherein said editing means edits the first parameter set without designating the model and edits the second parameter set after the model is designated; and supplying means for generating a job parameter from the first and second parameter sets stored in said storage means and supplying the job parameter to said semiconductor exposure apparatus.

11. The system according to claim 10, wherein said editing means designates a model and edits the second parameter set when editing of the first parameter set ends.

12. The system according to claim 10, wherein said editing means designates a model and edits the second parameter set when the first parameter set is used.

13. The system according to claim 10, wherein when the second parameter set is edited, said editing means sets a default parameter set that has been prepared in advance for a designated model.

14. The system according to claim 10, wherein when the second parameter set is edited, said editing means selects a parameter set that has been selected from a group of second parameter sets regarding a designated model and stored in said memory in advance.

15. The system according to claim 10, wherein said storage means groups and stores a plurality of the second parameter sets for each of a plurality of models.

16. The system according to claim 10, further comprising means for generating one set of job parameter sets from the first and second parameter sets edited by said editing means and storing this set in said storage means, said supply means supplying the generated job parameter to said semiconductor exposure apparatus.

17. The system according to claim 10, further comprising means for generating link information that links the first and second parameter sets edited by said editing means and for storing the first and second parameter sets and the link information in said storage means, said supplying means acquiring first and second parameter sets to be linked based upon the link information, generating a job parameter and supplying the job parameter to said semiconductor exposure apparatus.

18. The system according to claim 10, further comprising means for generating link information that links the first and second parameter sets edited by said editing means and stores the link information in said storage means, said supplying means acquiring first and second parameter sets to be linked based upon the link information and supplying these first and second parameter sets to said semiconductor exposure apparatus.

19. A parameter editing method for editing a job parameter that stipulates operation of a semiconductor exposure apparatus, said method comprising:

a storage step of dividing the job parameter into a first parameter set that is independent of the model of the semiconductor exposure apparatus and a second parameter set that is dependent upon the model of the semiconductor exposure apparatus, and storing the first and second parameter sets independently in a memory in an accessible fashion; and an editing step of editing the first and second parameter sets independently when the job parameter is to be edited, wherein the editing step includes editing the second parameter set after the model is designated.

20. A semiconductor exposure system comprising:

storage means for dividing a job parameter, which stipulates operation of a semiconductor exposure apparatus, into a first parameter set that is independent of the model of the semiconductor exposure apparatus and a second parameter set that is dependent upon the model of the semiconductor exposure apparatus, and storing the first and second parameter sets independently in an accessible fashion;

editing means for editing the first and second parameter sets independently when the job parameter is to be edited, wherein said editing means edits the second parameter set after the model is designated; and supplying means for generating a job parameter from the first and second parameter sets stored in said storage means and supplying the job parameter to said semiconductor exposure apparatus.

* * * * *